(12) United States Patent
Suzuki et al.

(10) Patent No.: US 10,903,040 B2
(45) Date of Patent: *Jan. 26, 2021

(54) COMPOSITE CHARGED PARTICLE BEAM APPARATUS

(71) Applicant: HITACHI HIGH-TECH SCIENCE CORPORATION, Tokyo (JP)

(72) Inventors: Hiroyuki Suzuki, Tokyo (JP); Shinya Kitayama, Tokyo (JP)

(73) Assignee: HITACHI HIGH-TECH SCIENCE CORPORATION

( * ) Notice: Subject to any disclaimer, the term of this patent is extended or adjusted under 35 U.S.C. 154(b) by 0 days.

This patent is subject to a terminal disclaimer.

(21) Appl. No.: 16/400,901

(22) Filed: May 1, 2019

(65) Prior Publication Data

US 2019/0259569 A1 Aug. 22, 2019

Related U.S. Application Data

(63) Continuation of application No. 14/868,526, filed on Sep. 29, 2015, now Pat. No. 10,312,051.

(30) Foreign Application Priority Data

Sep. 30, 2014 (JP) .................................. 2014-200340

(51) Int. Cl.
*H01J 37/20* (2006.01)

(52) U.S. Cl.
CPC ..... *H01J 37/20* (2013.01); *H01J 2237/20207* (2013.01); *H01J 2237/20214* (2013.01); *H01J 2237/31745* (2013.01)

(58) Field of Classification Search
CPC ............. H01J 37/20; H01J 2237/20207; H01J 2237/20214; H01J 2237/20242; H01J 2237/31745
See application file for complete search history.

(56) References Cited

U.S. PATENT DOCUMENTS

| | | | |
|---|---|---|---|
| 6,838,685 B1 * | 1/2005 | Kodama | G01N 1/32 250/442.11 |
| 10,312,051 B2 * | 6/2019 | Suzuki | H01J 37/20 |
| 2005/0236587 A1 * | 10/2005 | Kodama | H01J 37/3056 250/492.21 |
| 2007/0045560 A1 * | 3/2007 | Takahashi | H01J 37/304 250/442.11 |

(Continued)

FOREIGN PATENT DOCUMENTS

| | | |
|---|---|---|
| JP | 2001338599 | 12/2001 |
| JP | 2007066710 | 3/2007 |
| JP | 2014063726 | 4/2014 |

*Primary Examiner* — David E Smith
(74) *Attorney, Agent, or Firm* — Adams & Wilks

(57) ABSTRACT

A composite charged particle beam apparatus includes a first charged particle beam column that irradiates a thin sample with a first charged particle beam, a second charged particle beam column that irradiates an irradiation position of the first charged particle beam of the thin sample with a second charged particle beam, a sample holder that fixes the thin sample, and a sample stage on which the sample holder is mounted. The sample holder is able to rotate the thin sample within a surface parallel to an observation surface of the thin sample around a first rotational axis on the sample stage.

9 Claims, 6 Drawing Sheets

(56) References Cited

U.S. PATENT DOCUMENTS

| | | | | |
|---|---|---|---|---|
| 2007/0125958 A1* | 6/2007 | Tappel | ............... | H01J 37/3056 250/441.11 |
| 2011/0017922 A1* | 1/2011 | Amador | ................ | H01J 37/20 250/442.11 |
| 2012/0298884 A1* | 11/2012 | Nakajima | ............... | H01J 37/20 250/453.11 |
| 2013/0105302 A1* | 5/2013 | Nanri | ...................... | G01N 1/32 204/192.33 |
| 2014/0061159 A1 | 3/2014 | Asahata et al. | | |
| 2014/0292189 A1* | 10/2014 | Aramaki | ................ | H01J 37/08 315/1 |
| 2015/0348743 A1* | 12/2015 | Hanada | ................. | H01J 37/20 250/442.11 |

* cited by examiner

COMPOSITE CHARGED PARTICLE BEAM APPARATUS

CROSS REFERENCE TO RELATED APPLICATIONS

This application claims priority from Japanese Patent Application No. 2014-200340 filed on Sep. 30, 2014, the entire subject-matter of which is incorporated herein by reference.

TECHNICAL FIELD

The present disclosure relates to a composite charged particle beam apparatus for producing a thin sample by an ion beam.

BACKGROUND

In the related art, it is known that a Focused Ion Beam (FIB) by a Transmission Electron Microscope (TEM) produces an observable thin sample. Furthermore, it is also known that a damage layer is formed by injecting gallium a ionic species into the thin sample and irradiating the thin sample with a FIB.

In recent years, as a means for removing the damage layer, a finishing process has been proposed in which the thin sample is irradiated with a Gas Ion Beam (GIB) to remove the damage layer (see JP-2007-066710 A). According to such means, it is possible to form a thin sample having few damage layer.

However, in the means of the related art, if a structure such as a semiconductor device is exposed to an observation surface of the thin sample, since an etching rate of the GIB is varied by the presence or absence of the structure, a phenomenon in which irregularities are formed in the observation surface and become a streak, that is, a so-called curtain effect occurs. Thus, there is a problem that the streak formed by ion beam processing also appears in an observation image of the observation surface in addition to an original device structure.

Particularly, in a high technology device of recent years, various kinds of materials have been used. Thus, a difference in the etching rate may be remarkable. Furthermore, since the structure of a high technology device is small, an observation object is also small. Thus, even if irregularities appearing in the observation surface are small, the irregularities affect the observation.

SUMMARY

Illustrative aspects of the disclosure provide a composite charged particle beam apparatus in which a curtain effect is suppressed and it is possible to obtain an observation image having few streaks.

According to one illustrative aspect of the disclosure, there may be provided a composite charged particle beam apparatus comprising: a first charged particle beam column configured to irradiate a thin sample with a first charged particle beam; a second charged particle beam column configured to irradiate an irradiation position of the first charged particle beam of the thin sample with a second charged particle beam; a sample holder configured to hold the thin sample; and a sample stage, on which the sample holder is mounted, wherein the sample holder is configured to rotate the thin sample within a surface parallel to an observation surface of the thin sample around a first rotational axis on the sample stage.

The sample stage may be tiltable about a tilt axis, and eucentric positions of the tilt axis and the first rotational axis may coincide with each other.

The sample holder may be configured to rotate the thin sample within a surface perpendicular to the observation surface of the thin sample around a second rotational axis on the sample stage, the second rotational axis being substantially orthogonal to the first rotational axis.

The sample holder may comprise: a base stage disposed on the sample stage; a holder shaft rotatably attached to the base stage; a second rotation device configured to be rotated in accordance with rotation of the holder shaft; and a first rotation device accommodated in a concave section of the second rotation device, the first rotation device being rotatable independently of the second rotation device and being configured to hold the thin sample. The thin sample may rotate around the first rotational axis by rotation of the first rotation device. The thin sample may rotate around the second rotational axis by rotation of the second rotation device.

In the composite charged particle beam apparatus according to the disclosure, it is possible to suppress a curtain effect and to obtain the observation image having few streaks even in the thin sample having a structure such as a semiconductor device.

BRIEF DESCRIPTION OF THE DRAWINGS

In the accompanying drawings:

FIGS. 5A and 5B are views illustrating the movement of a TEM grid attached to the uppermost portion of the worm wheel in the sample holder, in which FIG. 5A is a schematic view illustrating the movement of the TEM grid according to rotation of the worm wheel, and FIG. 5B is a schematic view illustrating the movement of the TEM grid according to the rotation of a rotation stand.

DETAILED DESCRIPTION

Figure 1:
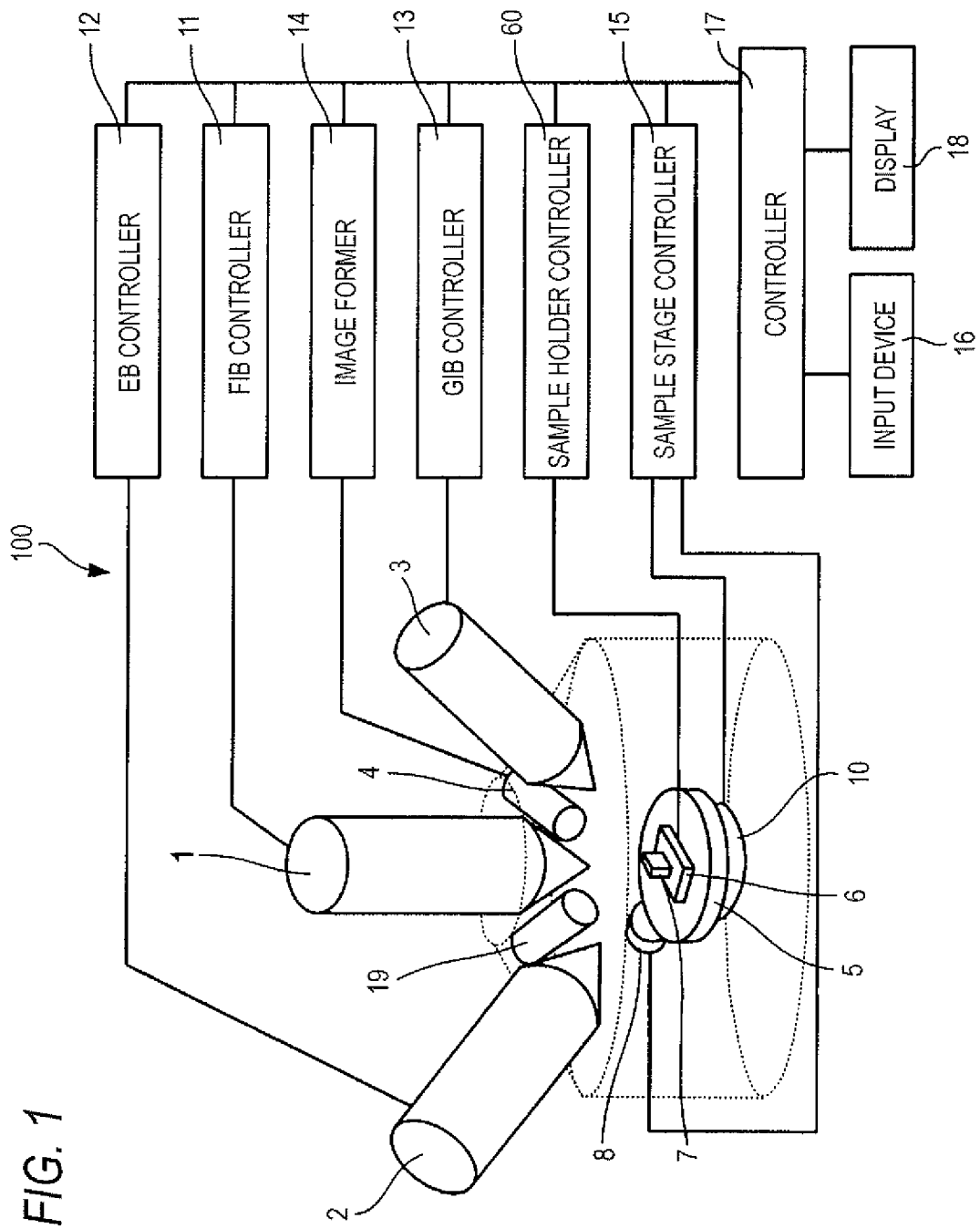
FIG. 1 is an entire configuration view of a composite charged particle beam apparatus of an exemplary embodiment according to the disclosure.

Hereinafter, an exemplary embodiment of a composite charged particle beam apparatus according to the disclosure will be described. FIG. 1 illustrates an entire configuration of a composite charged particle beam apparatus 100 of the exemplary embodiment. The composite charged particle beam apparatus 100 includes a FIB column (first charged particle beam column) 1 that irradiates a sample with a Focused Ion Beam (FIB) as a first charged particle beam, an EB column (second charged particle beam column) 2 that irradiates the sample with an Electron Beam (EB) as a second charged particle beam, and a GIB column 3 that irradiates the sample with a Gas Ion Beam (GIB).

The FIB column 1 includes a liquid metal ion source. Furthermore, the GIB column 3 includes a PIG type gas ion source. The gas ion source uses helium, argon, xenon, oxygen, and the like as ion source gas.

The composite charged particle beam apparatus 100 further includes a secondary electron detector 4 for detecting secondary electrons generated from a thin sample 7 by irradiating the thin sample 7 with the EB, the FIB, or the GIB. Furthermore, the composite charged particle beam apparatus 100 may also include a reflected electron detector for detecting a reflected electron generated from the thin sample 7 by irradiating the thin sample 7 with the EB.

The composite charged particle beam apparatus 100 further includes a sample holder 6 for holding and fixing the thin sample 7 and a sample stage 5 for mounting the sample holder 6. The sample stage 5 is able to move in a three-axis direction of XYZ (not illustrated). Furthermore, as described below, the sample stage 5 is also able to tilt and rotate.

The composite charged particle beam apparatus 100 further includes a sample stage controller 15. The sample stage controller 15 moves the sample stage 5 in the three-axis direction of XYZ by controlling a driving mechanism (not illustrated). Furthermore, the sample stage controller 15 tilts the sample stage 5 by controlling a tilt driving section 8 and rotates the sample stage 5 by controlling a rotation driving section 10.

The composite charged particle beam apparatus 100 further includes a sample holder controller 60. The sample holder controller 60 sets an orientation of the thin sample 7 to be a desired orientation by driving the sample holder 6 disposed on the sample stage 5. A detailed configuration and operation of the sample holder 6 will be described later.

The composite charged particle beam apparatus 100 further includes a FIB controller 11, an EB controller 12, a GIB controller 13, an image former 14, and a display 18. The EB controller 12 controls EB irradiation from the EB column 2. The FIB controller 11 controls FIB irradiation from the FIB column 1. The GIB controller 13 controls GIB irradiation from the GIB column 3. The image former 14 forms a SEM image from a signal causing the thin sample 7 to be irradiated with the EB and a signal of the secondary electron detected by the secondary electron detector 4. The display 18 is able to display observation images such as the SEM image, various control conditions of the apparatus, and the like. Furthermore, the image former 14 forms a SIM image from a signal causing the thin sample 7 to be irradiated with the FIB and a signal of the secondary electron detected by the secondary electron detector 4. The display 18 is able to display the SIM image.

The composite charged particle beam apparatus 100 further includes an input device 16 and a controller 17. An operator inputs conditions regarding apparatus control into the input device 16. The input device 16 transmits input information to the controller 17. The controller 17 transmits a control signal to the FIB controller 11, the EB controller 12, the GIB controller 13, the image former 14, the sample stage controller 15, the display 18, and the sample holder controller 60, and controls the entirety of the apparatus.

For the control of the apparatus, for example, the operator sets irradiation regions of the FIB and the GIB based on the observation images such as the SEM image and the SIM image displayed in the display 18. The operator inputs a processing frame for setting the irradiation region on the observation image displayed in the display 18 by the input device 16. Furthermore, if the operator inputs instructions of processing start into the input device 16, signals of the irradiation region and the processing start are transmitted from the controller 17 to the FIB controller 11 or the GIB controller 13, and a set irradiation region of the thin sample 7 is irradiated with the FIB from the FIB controller 11 or with the GIB from the GIB controller 13. Thus, the irradiation region that is input by the operator can be irradiated with the FIB or the GIB.

In addition, the composite charged particle beam apparatus 100 includes a gas gun 19 for supplying etching gas in the vicinity of the irradiation region of the EB, the FIB, or the GIB of the thin sample 7. As the etching gas, chlorine gas, fluorine gas (xenon fluoride, fluorocarbon, and the like), and halogen gases such as iodine gas are used. It is possible to apply gas assisted etching by the EB, the FIB, or the GIB by using the etching gas which reacts with a material of the thin sample 7. Particularly, in the gas assisted etching with the EB, it is possible to perform etching processing without damaging the thin sample 7 by ion sputtering.

Figure 2:
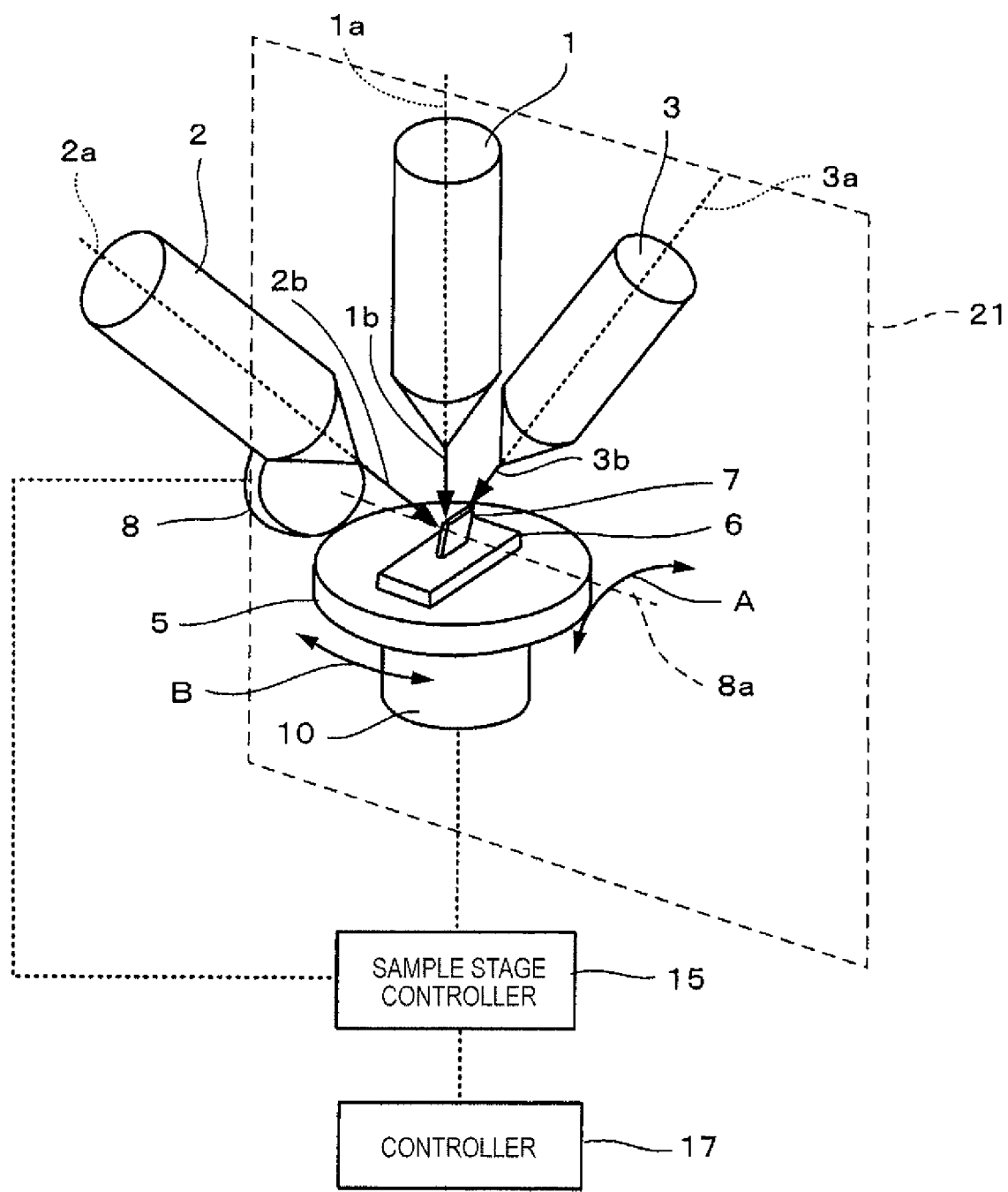
FIG. 2 is a configuration view of a main portion of the composite charged particle beam apparatus of the exemplary embodiment and a view illustrating an operation of a sample stage and an arrangement relationship between columns.

FIG. 2 illustrates a main portion of the composite charged particle beam apparatus 100 and illustrates an arrangement relationship between an operation of the sample stage 5 and the columns. In order to perform the SEM observation of the thin sample 7 during processing by a FIB 1b or a GIB 3b, a FIB irradiation axis 1a of the FIB column 1 and an EB irradiation axis 2a of the EB column 2, and the EB irradiation axis 2a of the EB column 2 and a GIB irradiation axis 3a of the GIB column 3 are arranged to intersect each other on the thin sample 7 of which a position is adjusted by moving the sample stage 5. That is, an irradiation position of the FIB 1b of the FIB column 1, an irradiation position of an EB 2b of the EB column 2, and an irradiation position of the GIB 3b of the GIB column 3 coincide on the thin sample 7.

The sample stage 5 is orthogonal to the FIB irradiation axis 1a and can be tilted by the tilt driving section 8 as a tilt mechanism around a tilt axis 8a that is positioned within a surface of a first surface 21 formed by the FIB irradiation axis 1a and the GIB irradiation axis 3a. That is, the tilt driving section 8 as the tilt mechanism is driven by the controls of the controller 17 and the sample stage controller 15, and tilts the sample stage 5 as indicated by arrow A.

Furthermore, the sample stage 5 is also capable of rotation manipulation in which the thin sample 7 is rotated within a plane using the rotation driving section 10. That is, the rotation driving section 10 as a rotation mechanism is driven under controls of the controller 17 and the sample stage controller 15, and rotates the sample stage 5 within the plane as indicated by arrow B. For the rotation driving section 10 as the rotation mechanism, various mechanisms such as a servo motor may be used and types thereof are not particularly limited.

Figure 3:
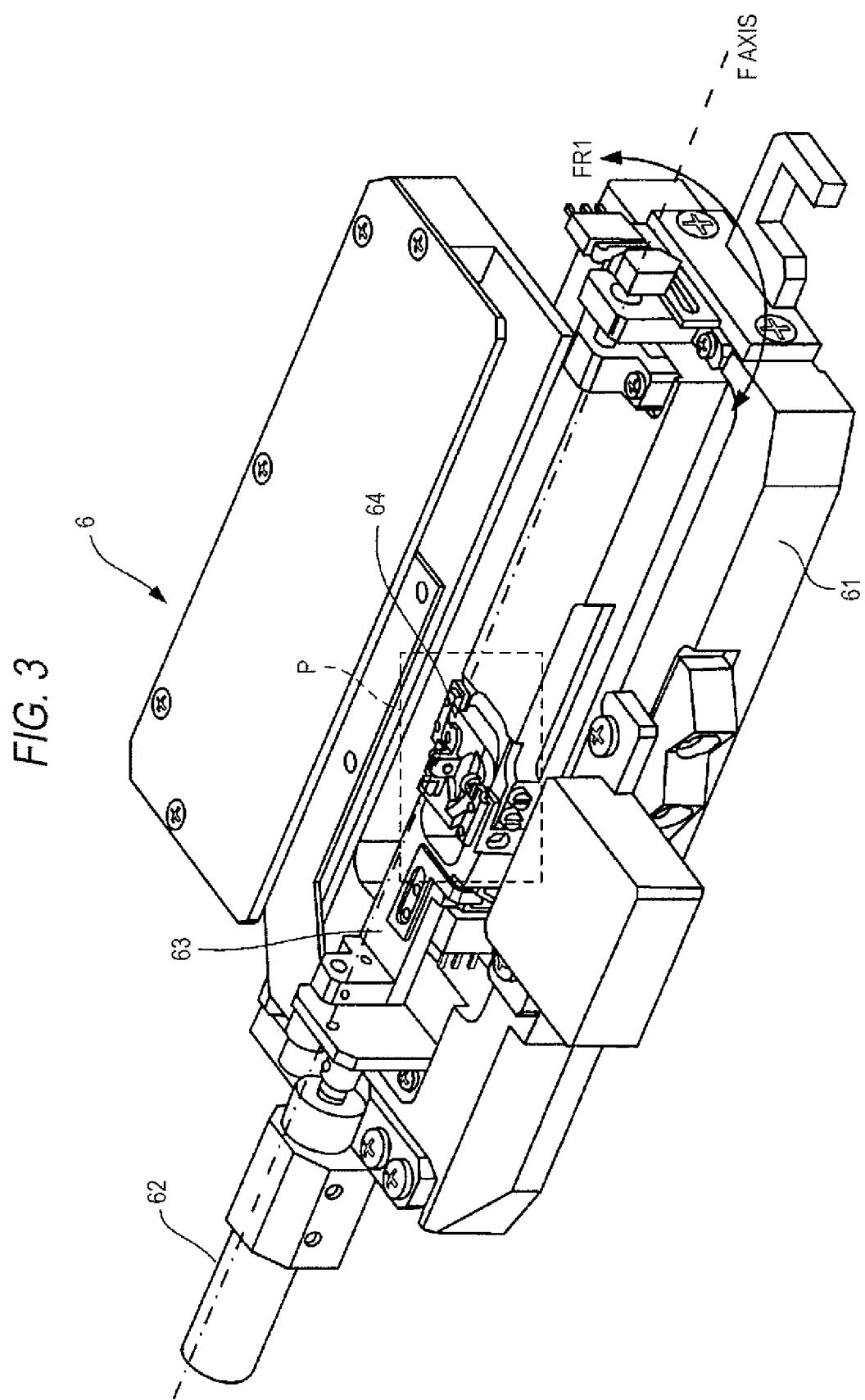
FIG. 3 is a perspective view of a sample holder mounted on the sample stage.

Next, a configuration, an action, and an operation of the sample holder 6 disposed on the sample stage 5 will be described. As illustrated in FIG. 3, the sample holder 6 includes a base stage 61 directly disposed on the sample stage 5, a holder shaft 62, a rotation stand 63 as a second rotation unit, and a worm wheel 64 as a first rotation unit. The holder shaft 62 is rotated by power from a motor (not illustrated) that is driven by an external power supply. The plate-shaped rotation stand 63 is connected to the holder shaft 62 in an upper space of the base stage 61 through a reduction gear and the like and rotates (oscillates) in a FR1 direction around an F axis (flip axis) as a shaft axis with rotation of the holder shaft 62.

Figure 4:
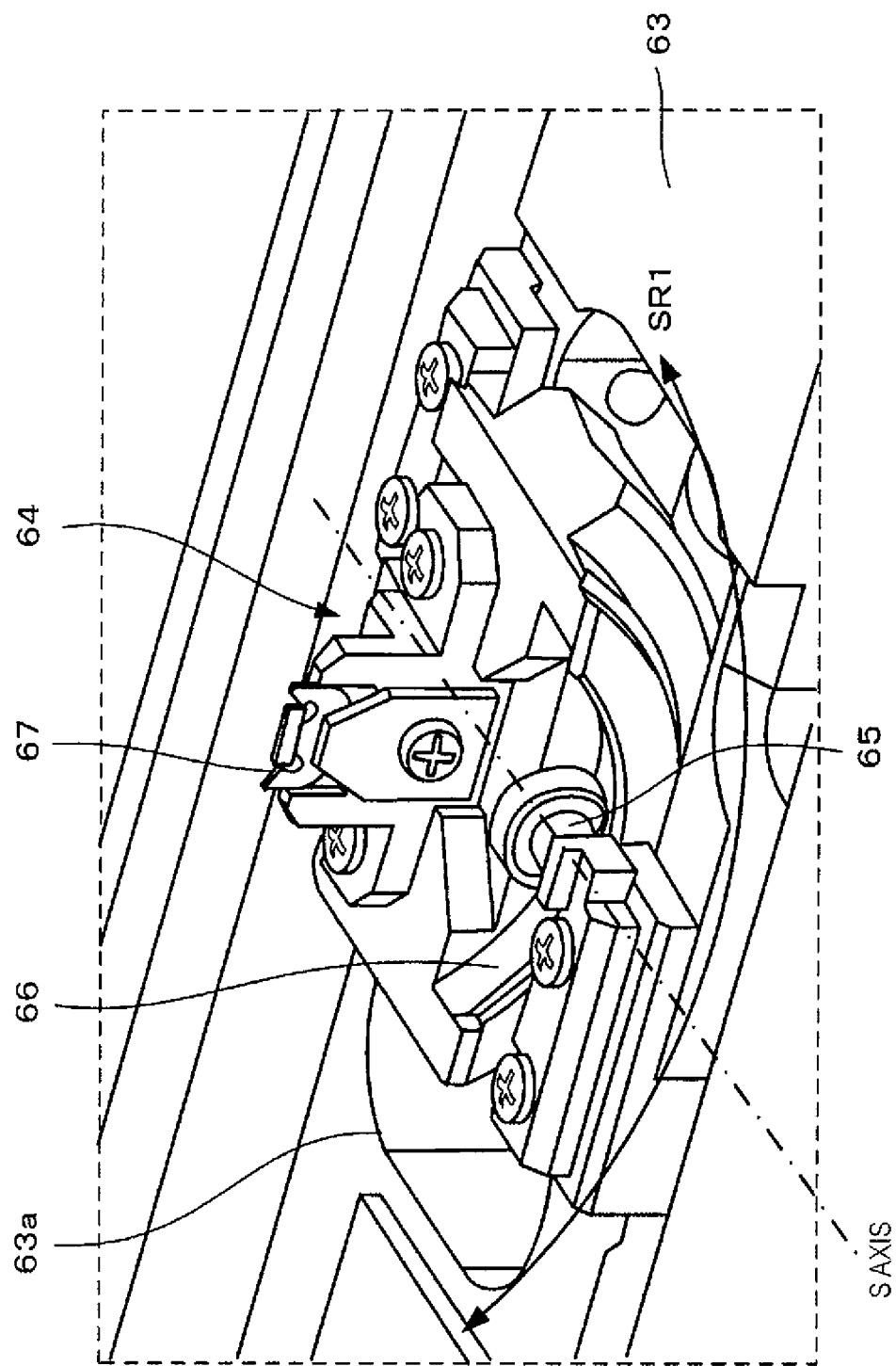
FIG. 4 is an enlarged view of P portion of FIG. 3 and a view mainly illustrating an enlarged perspective view of a worm wheel.

FIG. 4 is an enlarged view of P portion of FIG. 3. The worm wheel 64 is accommodated in a concave section 63a formed in the rotation stand 63. A guide groove 66 formed in an arc shape is formed in the worm wheel 64. A roller 65 that is provided in the rotation stand 63 and is driven independently of the rotation stand 63 is fitted in the guide groove 66 in a rotatable state while sliding in the guide groove 66. If the roller 65 rotates, since the roller 65 rotates while sliding in the guide groove 66 without idling, by the rotation of the roller 65, the worm wheel 64 rotates (oscillates) in a SR1 direction around an S axis (swing axis) as a roller axis. Thus, the worm wheel 64 is able to rotate (able to oscillate) independently of the rotation stand 63.

Figure 5A:
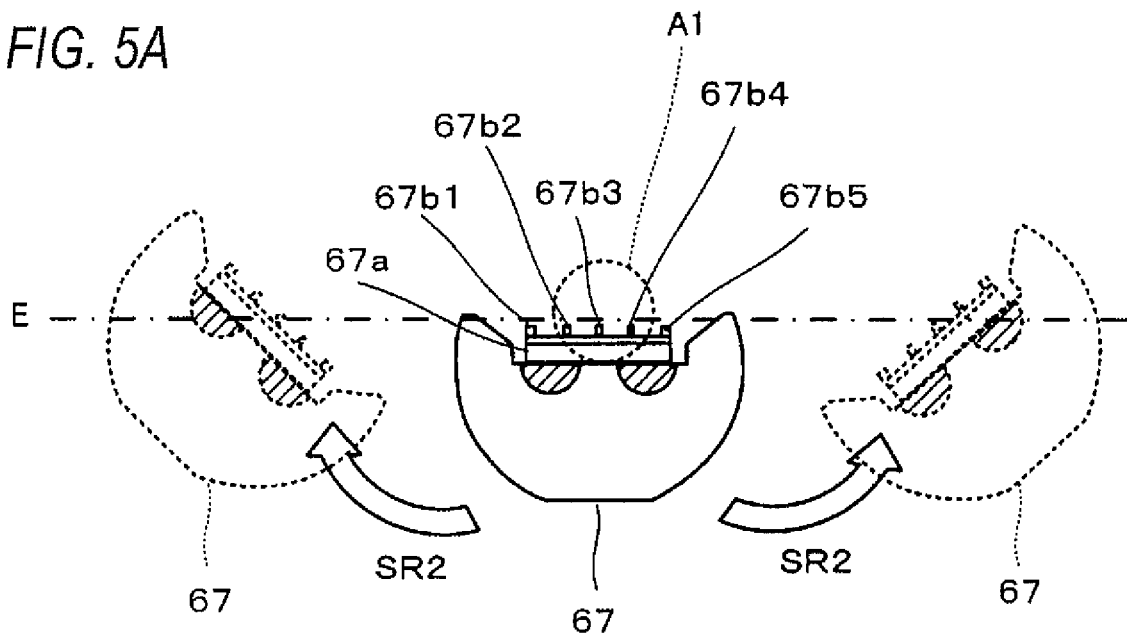

A TEM grid 67 as a sample holding section to which the thin sample 7 can be directly attached is provided on the uppermost portion of the worm wheel 64. As illustrated in FIG. 5A, the TEM grid 67 is created by a thin plate, a sample holding stage 67*a* is formed at a center portion thereof, and five posts 67*b*1, 67*b*2, 67*b*3, 67*b*4, and 67*b*5 are formed on the sample holding stage 67*a*. The thin sample 7 is attached to the posts 67*b*1 to 67*b*5.

Figure 5B:
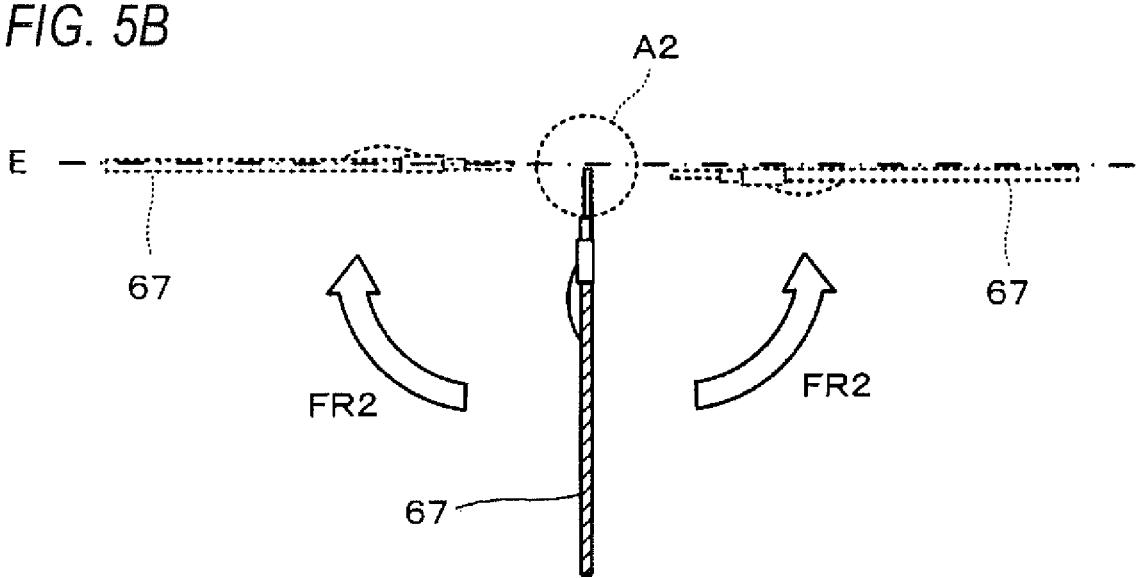

The TEM grid 67 moves as illustrated in FIGS. 5A and 5B according to the rotation of the rotation stand 63 and the worm wheel 64, and the thin sample 7 attached to the TEM grid 67 also moves. FIG. 5A illustrates an operation of the TEM grid 67 with the rotation of the worm wheel 64. The TEM grid 67 rotates in an arrow SR2 in conjunction with a movement arrow SR1 of the worm wheel 64 in FIG. 4. FIG. 5B illustrates the operation of the TEM grid 67 according to the rotation of the rotation stand 63. The TEM grid 67 rotates in an arrow FR2 in conjunction with a movement arrow FR1 of the rotation stand 63 in FIG. 3.

As illustrated in FIG. 5A, in the exemplary embodiment, the worm wheel 64 and the TEM grid 67 are able to rotate the thin sample 7 within a surface parallel to the observation surface of the thin sample 7 around a first rotational axis A1 extending in a direction perpendicular to a plane of FIG. 5A on the sample stage 5. The first rotational axis A1 is parallel to the S axis of FIG. 4. The first rotational axis A1 is a virtual axis in which the TEM grid 67 rotates around the first rotary axis A1. Then, the observation surface of the thin sample 7 is extended in the direction parallel to the plane of FIG. 5A, that is, in the direction perpendicular to the first rotational axis A1 and the thin sample 7 rotates within the surface parallel to the plane of FIG. 5A, that is, the observation surface. Furthermore, the first rotational axis A1 coincides with a position of the post 67*b*3 positioned at the center of the posts 67*b*1 to 67*b*5.

Here, as illustrated in FIG. 2, the sample stage 5 is able to be tilted around the tilt axis 8*a* and eucentric positions of the tilted axis 8*a* and the first rotational axis A1 coincide with each other. That is, a reference line E indicated in FIGS. 5A and 5B indicates the eucentric position, and the tilt axis 8*a* and the first rotational axis A1 are positioned on the reference line E. Here, the eucentric position corresponds to the irradiation positions of the FIB 1*b* and the EB 2*b* (and the GIB 3*b*) on the thin sample 7. It is possible to perform accurate processing and observation by such a configuration without deviation of the irradiation object from an original irradiation position, even if tilting of the sample stage 5 and the rotation of the TEM grid 67 illustrated in FIG. 5A are simultaneously performed.

In addition, the direction in which the first rotational axis A1 extends is fixed in the direction perpendicular to the plane of FIG. 5A, but since the direction in which the tilt axis 8*a* extends is changed due to the rotation by the rotation driving section 10 of the sample stage 5, the direction is not fixed in FIG. 5A.

As illustrated in FIG. 5B, in the exemplary embodiment, the rotation stand 63 and the TEM grid 67 are able to rotate the thin sample 7 within the surface perpendicular to the observation surface of the thin sample 7 around a second rotational axis A2 extending in a direction perpendicular to a plane of FIG. 5B on the sample stage 5. The second rotational axis A2 coincides with the F axis of FIG. 3. The second rotational axis A2 is a virtual axis in which the TEM grid 67 rotates around the second rotational axis A2. Then, the observation surface of the thin sample 7 is extended in the direction perpendicular to the plane of FIG. 5B, that is, in a direction parallel to the second rotational axis A2, and the thin sample 7 rotates within the plane of FIG. 5B, that is, the surface perpendicular to the observation surface. Furthermore, the eucentric positions of the tilt axis 8*a* of the sample stage 5 and the second rotational axis A2 coincide each other.

In addition, in FIGS. 5A and 5B, in order to facilitate understanding of the movement of the TEM grid 67, three TEM grids 67, which are in rotation positions that are different from each other, are illustrated in separate states in the horizontal direction. However, in an actual apparatus, since the TEM grid 67 rotates around the first and the second rotational axes A1 and A2, the three TEM grids 67, which are positioned in different positions, are not in separate states.

Figure 6:
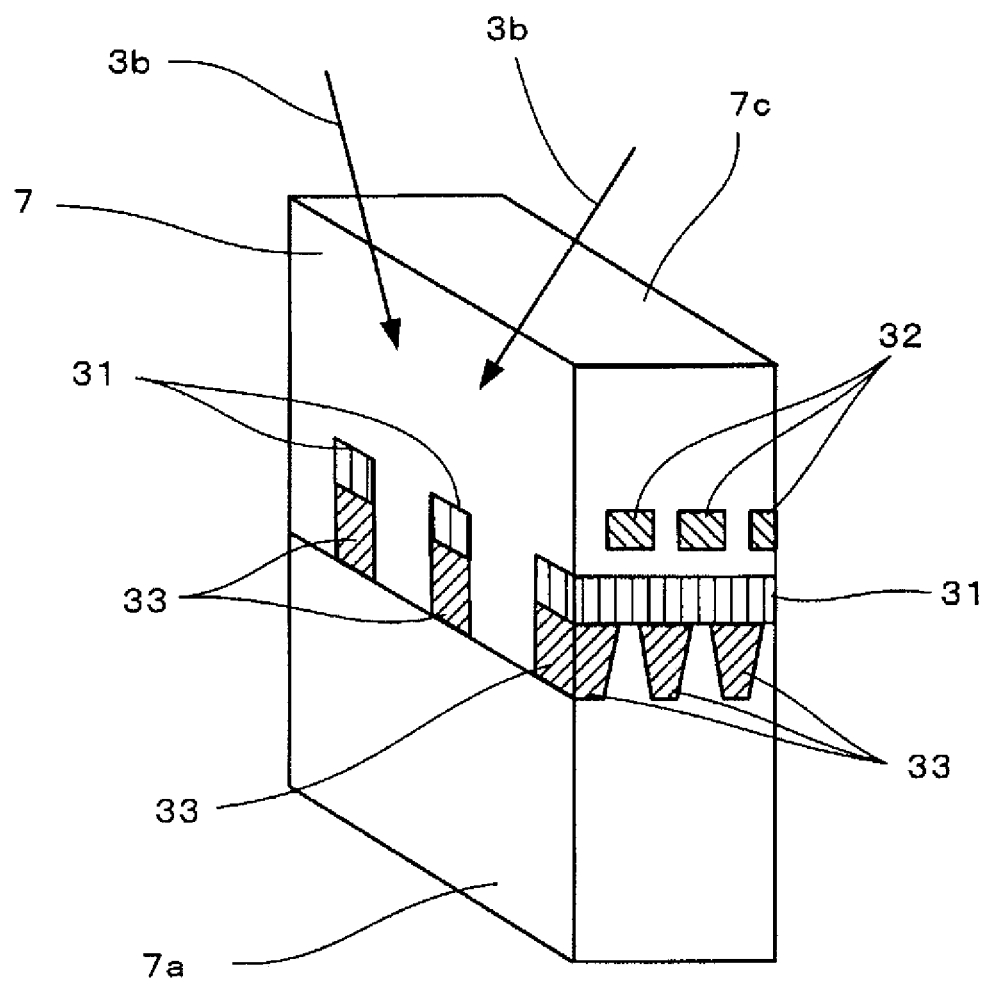
FIG. 6 is a schematic view of a thin sample as a processing and observation object.

FIG. 6 is a schematic view of the thin sample 7 which is obtained by cutting out a part of a semiconductor device. The thin sample 7 has structures 31, 32, and 33 of the device. The structures 31 and 33 are exposed on cross section 7*a* and are the observation surface. The FIB 1*b*, the EB 2*b*, and the GIB 3*b* are applied from a side of an upper surface 7*c*.

For such a cross section, if the charged particle beam is applied from one direction, since etching rates are different from each other in a portion in which the structure is present and a portion in which the structure is not present, irregularities are formed on the cross section. When performing SEM-observation of the cross section in which irregularities are formed, the streaks caused by irregularities are contained in the observation image. Since the streaks are formed by ion beam processing, the streaks are not the structures and defects in the semiconductor device. When the streaks appear in the observation image, the streaks may be recognized as the structures and defects in the semiconductor device.

In the composite charged particle beam apparatus 100 of the exemplary embodiment, the sample stage 5 is able to be tilted around the tilt axis 8*a* by the operation of the tilt driving section 8, is able to be rotated by the operation of the rotation driving section 10, and can change a relative position (orientation) of the thin sample 7 with respect to the FIB column 1, the EB column 2, and the GIB column 3. Furthermore, the sample holder 6 on the sample stage 5 can change the relative position (orientation) of the thin sample 7 with respect to the FIB column 1, the EB column 2, and the GIB column 3 by the operation illustrated in FIGS. 5A and 5B. For example, it is possible to precisely set the irradiation direction of the GIB 3*b* from the GIB column 3 to the thin sample 7 by a combination of the movements of the sample stage 5 and the sample holder 6. Thus, irregularities generated in the cross section 7*a* as the observation surface of the thin sample 7 generated by the etching process by the GIB 3*b* from one side can be freely etching-processed by the GIB 3*b* from the other side and it is possible to suppress the formation of irregularities by the structure of the device which is exposed to the cross section 7*a*. In addition, since the relative position (orientation) of the thin sample 7 with respect to the FIB column 1, the EB column 2, and the GIB column 3 can be changed in the eucentric position, for example, the irradiation of the thin sample 7 with the beam is uniformly performed by continuously and reciprocally driving the TEM grid around the S axis or the F axis during irradiating the thin sample 7 with the beam. Thus, it is possible to suppress the formation of irregularities by the structure of the device. Furthermore, it is possible to suppress the generation of excessive streaks in the obtained observation image of the observation surface and to perform observation with high accuracy.

In addition, an example, in which the irradiation direction of the GIB 3*b* with respect to the thin sample 7 is changed, is described in this example, but it is also possible to change the irradiation directions of the FIB 1 *b* and the EB 2*b* with respect to the thin sample 7.

In the above description, the FIB column 1 is disposed in the vertical direction, but the FIB column 1 and the EB column 2 may be disposed by replacing the FIB column 1 and the EB column 2 with each other.

Furthermore, generally, finishing of the thin sample 7 is performed by the GIB 3*b*, but gas assisted etching by the EB 2*b* or the FIB 1*b* may be used instead of the GIB 3*b*. When using the FIB 1*b*, in processing of forming the cross section 7*a* of the thin sample 7 or finishing, it is preferable that beam energy of the FIB 1 *b* is changed. That is, in processing of forming the cross section 7*a* of the thin sample 7, a steep cross section is formed at a high speed using the FIB 1 *b* in which an acceleration voltage is accelerated at 30 kV to 40 kV and with a beam having a small beam diameter. In finishing, processing causing little damage is performed by using a beam having a small penetration depth into the thin sample 7 using the FIB 1*b* of a low acceleration of approximately 1 kV to 10 kV of the acceleration voltage. Thus, it is possible to perform finishing causing little damage.

Furthermore, details such as a size of the sample holder 6 and an attaching method of the thin sample 7 are not particularly limited, and can be appropriately selected depending on the observation surface. Furthermore, it is possible to process both of a front surface and a rear surface of the thin sample 7 by switching the front surface and the rear surface thereof.

In addition, in the above-described exemplary embodiment, the detailed configuration of the sample holder 6 is illustrated. However, the configuration of the sample holder 6 is not limited to the above-described exemplary embodiment. That is, the sample holder 6 is usable as long as the sample holder can rotate the thin sample 7 within the surface parallel to the observation surface of the thin sample 7 around the first rotational axis A1 on the sample stage 5 and the worm wheel 64 of the exemplary embodiment is not an essential configuration. In addition, the sample holder 6 is usable as long as the sample holder can rotate the thin sample 7 within the surface perpendicular to the observation surface of the thin sample 7 around the second rotational axis A2 that is substantially orthogonal to the first rotational axis A1 and the rotation stand 63 of the exemplary embodiment is not an essential configuration.

In addition, the invention is not limited to the above-described exemplary embodiment and may be appropriately changed, improved, and the like. In addition, a material, a shape, a dimension, a numerical value, a form, the number, an arrangement position of each configuration element, and the like in the above-described exemplary embodiment are arbitrary as long as it can achieve the invention, and are not limited.

In the composite charged particle beam apparatus according to the invention, since the irradiation directions of various beams with respect to the thin sample can be precisely set, it is possible to suppress the curtain effect and to obtain the observation image having few streaks.

What is claimed is:

1. A composite charged particle beam apparatus comprising:
   a first charged particle beam column configured to irradiate a thin sample with a first charged particle beam;
   a second charged particle beam column configured to irradiate an irradiation position of the first charged particle beam of the thin sample with a second charged particle beam;
   a sample holder configured to hold the thin sample; and
   a sample stage, on which the sample holder is mounted, and which is configured to move the sample holder in a three-axis direction of XYZ and to tilt and rotate the sample holder,
   wherein the sample holder is configured to oscillate or swing the thin sample independently of the sample stage within a surface parallel to an observation surface of the thin sample around a first rotational axis on the sample stage, wherein the sample stage is tiltable about a tilt axis, and wherein eucentric positions of the tilt axis and the first rotational axis coincide with each other.

2. The composite charged particle beam apparatus according to claim 1,
   wherein the sample holder is configured to rotate the thin sample within a surface perpendicular to the observation surface of the thin sample around a second rotational axis on the sample stage, the second rotational axis being substantially orthogonal to the first rotational axis.

3. The composite charged particle beam apparatus according to claim 2,
   wherein the sample holder comprises:
      a base stage disposed on the sample stage;
      a holder shaft rotatably attached to the base stage;
      a second rotation device configured to be rotated in accordance with rotation of the holder shaft; and
      a first rotation device accommodated in a concave section of the second rotation device, the first rotation device being rotatable independently of the second rotation device and being configured to hold the thin sample,
   wherein the thin sample rotates around the first rotational axis by rotation of the first rotation device, and
   wherein the thin sample rotates around the second rotational axis by rotation of the second rotation device.

4. The composite charged particle beam apparatus according to claim 3,
   wherein eucentric positions of the tilt axis and the second rotational axis coincide each other.

5. The composite charged particle beam apparatus according to claim 1,
   wherein the eucentric positions of the tilt axis and the first rotational axis, which coincide each other, correspond to the irradiation positions of the first charged particle beam and the second charged particle beam.

6. The composite charged particle beam apparatus according to claim 1,
   wherein the sample holder comprises:
      a first rotation device comprising a guide groove;
      a second rotation device comprising a roller rotatable around a roller axis and slidable in the guide groove, wherein the first rotational axis is parallel to the roller axis, and
   wherein the first rotation device is swingable around a swing axis, which coincides with the roller axis, by receiving the rotation of the roller, so as to rotate the thin sample around the first rotational axis.

7. The composite charged particle beam apparatus according to claim 6,
wherein the sample holder further comprises:
a base stage disposed on the sample stage; and
a holder shaft attached to the base stage and rotatable around a shaft axis, and
wherein the second rotation device is coupled to the holder shaft and is configured to rotate around a second rotational axis, which coincides with the shaft axis of the holder shaft, so as to rotate the thin sample around the second rotational axis.

8. A composite charged particle beam apparatus comprising:
a focused ion beam column configured to irradiate a thin sample with a focused ion beam;
an electron beam column configured to irradiate an irradiation position of the focused ion beam of the thin sample with an electron beam;
a gas ion beam column, which is tilted with respect to an irradiation axis of the focused ion beam irradiated from the focused ion beam column, and which is configured to irradiate the irradiation position of the focused ion beam of the thin sample with a gas ion beam;
a sample holder configured to hold the thin sample; and
a sample stage on which the sample holder is mounted,
wherein the sample holder is configured to oscillate or swing the thin sample within a surface which is parallel to an observation surface of the thin sample around a first rotational axis on the sample stage and through which an irradiation axis of the gas ion beam column passes,
wherein the sample holder comprises a first rotation device having a guide groove, and a second rotation device comprising a roller rotatable about a roller axis and slidable in the guide groove, the first rotational axis being parallel to the roller axis, and
wherein the first rotation device is swingable around a swing axis, which coincides with the roller axis, by receiving the rotation of the roller, so as to rotate the thin sample around the first rotational axis.

9. A composite charged particle beam apparatus comprising:
a first charged particle beam column configured to irradiate a thin sample with a first charged particle beam;
a second charged particle beam column configured to irradiate an irradiation position of the first charged particle beam of the thin sample with a second charged particle beam;
a sample holder configured to hold the thin sample;
a sample stage on which the sample holder is mounted; and
a rotation driving section configured to rotate the sample stage wherein the sample stage is tiltable about a tilt axis, and wherein eucentric positions of the tilt axis and the first rotational axis coincide with each other;
wherein the sample holder is configured to oscillate or swing the thin sample within a surface parallel to an observation surface of the thin sample around a first rotational axis on the sample stage, and
wherein the sample holder comprises:
a base stage disposed on the sample stage; and
a holder shaft rotatably attached to the base stage, and
wherein the holder shaft is driven by a motor that is driven by an external power supply.

* * * * *